Oct. 30, 1962 J. E. R. HARRISON 3,061,742
STABLE TRANSISTOR FREQUENCY CHANGER HAVING A STABLE MULTIVIBRATOR WITH SYNCHRONIZING PULSE INPUT
Filed Dec. 28, 1959
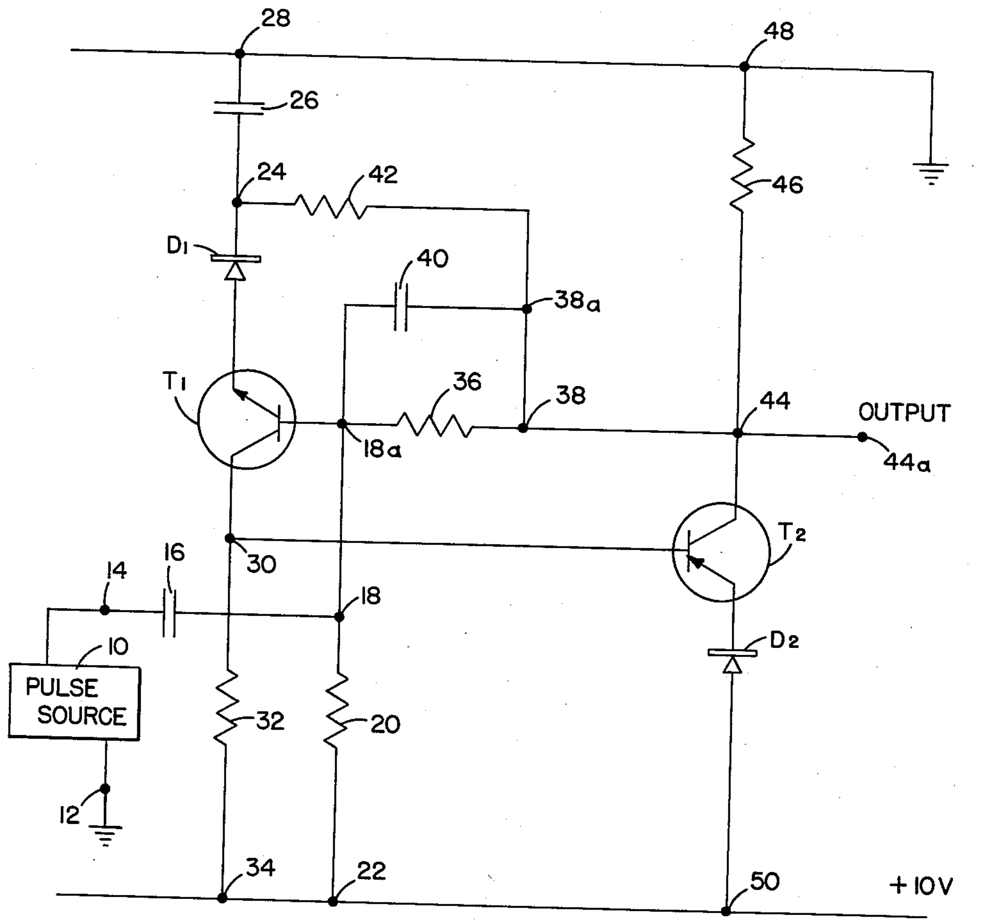
INVENTOR.
JOHN E. R. HARRISON
BY
[signature]
ATTORNEY

United States Patent Office 3,061,742

Patented Oct. 30, 1962

3,061,742

STABLE TRANSISTOR FREQUENCY CHANGER HAVING A STABLE MULTIVIBRATOR WITH SYNCHRONIZING PULSE INPUT

John E. R. Harrison, Rochester, N.Y., assignor to General Dynamics Corporation, Rochester, N.Y., a corporation of Delaware Filed Dec. 28, 1959, Ser. No. 862,125
12 Claims. (Cl. 307—88.5)

This invention relates to an electronic circuit that functions as a frequency divider or multiplier.

In the past, the circuit components in frequency multiplier and divider circuits have been tubes and coils. For many applications, circuits using such components leave much to be desired with respect to space and weight requirements.

Some circuits, that have been designed for use in frequency division and multiplication, using resistance and capacitance components, have been limited as to frequency range, or as to the temperature range over which the circuits were operable.

One object of the present invention is to provide a practical circuit that can be used for frequency division and multiplication over a wide range of frequencies and over a wide temperature range.

Another object of the invention is to provide a practical frequency multiplier and divider, that has an output that is characterized by high discrimination between output pulses.

Another object of the invention is to provide a practical electronic circuit for frequency multiplication and division, that is characterized by output pulses having a very fast rise time and a relatively fast fall time.

Another object of the invention is to provide a circuit of the character described using semiconductor devices as the electronic valves.

Another object of the invention is to provide a practical circuit of the character described that is easily modified to effect a desired frequency division or multiplication by simple adjustment of the values of a relatively small number of circuit components.

A further object of the invention is to provide a circuit of the character described that has stable operation characteristics over a wide temperature range.

Still another object of the invention is to provide an electronic circuit of the character desired, that is compact and of light weight, so as to impose upon the designer of equipment utilizing the circuit minimum requirements as to weight and volume.

Other objects of the invention will become apparent hereinafter from the specification and from the recital of the appended claims.

The drawing is a schematic circuit diagram of a frequency divider that is constructed in accordance with one embodiment of the present invention.

Referring now to the drawing by numerals of reference, the numeral 10 denotes a pulse source. One lead from the pulse source is connected to a grounded junction 12. The other lead from the pulse source 10 is connected to a junction 14 that is connected to a capacitor 16. The other side of the capacitor 16 is connected to a junction 18. The junction 18 is connected through a resistor 20 to a junction 22 that is connected to a source of positive reference potential.

The junction 18 is also connected to another junction 18*a*. The junction 18*a* is connected to the base electrode of an NPN transistor T1. The emitter electrode of the transistor T1 is connected to one terminal of a diode D1. The other terminal of the diode D1 is connected to a junction 24. The junction 24 is connected through a capacitor 26 to a junction 28, that is connected to a source of zero reference potential.

The collector electrode of the transistor T1 is connected through a junction 30 and a resistor 32 to a junction 34 that is also connected to the source of positive reference potential.

The junction 18*a* is also connected through an electrical resistor 36 to a junction 38. The junction 18*a* is also connected to a capacitor 40 that is connected to a junction 38*a* that is connected to the junction 38. An electrical resistor 42 is interposed between the junction 24 and the junction 38*a*. The junction 38 is connected to another junction 44 in the collector circuit of a second transistor T2. The output terminal 44*a* is connected to the junction 44. An electrical resistor 46 is connected between the junction 44 and a junction 48 that is connected to the source of zero reference potential.

The base electrode of the transistor T2 is connected to the junction 30 in the collector electrode circuit of the transistor T1.

The emitter electrode of the transistor T2 is connected to one terminal of a diode D2. The other terminal of the diode D2 is connected to a junction 50 that is connected to the source of positive reference potential.

The circuit is essentially a free running multivibrator with several modifications to enhance stability in spite of temperature and transistor variations.

As power is applied to the circuit, current flows through the resistor 20, through the base-emitter junction of the driving transistor T1, the diode D1 (in the forward conductance direction), and through the capacitor 26 to ground. The capacitor 26 makes the emitter of the transistor T1 virtually grounded to the initial surge of current.

The current that passes through the base-emitter junction of the driving transistor T1 causes transistor action, and a flow of collector current, which comes through the resistor 32 and also through the base-emitter junction of the output transistor T2. The current flow in the base-emitter junction of the output transistor T2 causes transistor action in the output transistor, and current flow through its collector junction and through the load resistor 46.

The current flow in the collector circuit of the output transistor T2 causes a positive going voltage to pass through the resistor 36 and the capacitor 40, in phase with the original turn on voltage for the circuit, and thus aids the turn on function for the entire circuit. Current also passes through the resistor 46, also to aid the turn on function, and current also passes through the resistor 42, to charge the capacitor 26.

When the capacitor 26 is fully charged, and the voltage at the collector electrode of the output transistor T2 reaches saturation, there is no potential difference between the base and the emitter electrodes of the driving transistor T1, and thus no current flows and the transistor action ceases. As the driving transistor T1 turns off, no current flows through the base of the output transistor T2, and it also turns off. The collector voltage of the output transistor T2 thus falls back toward the zero reference potential of the junction 48 (ground), and the two electrical resistors 36, 20, form a voltage divider that together set a voltage at the base electrode of the driving transistor T1. Since the capacitor 26 is charged to approximately plus 10 volts at this point, there is a reverse bias on the diode D1, and also on the emitter electrode of the driving transistor T1. The very high reverse resistance of the diode D1 prevents current flow in the reverse direction through the diode, and accordingly, the only discharge path for the capacitor 26 is through the resistor 42.

The leakage currents of the two transistors T1, T2, pass in opposite directions through the electrical resistor 32, so that the voltage at the base electrode of the output transistor T2 is fixed independent of temperature, at a voltage that is below the forward conductance breakdown voltage of the diode D2. Therefore, no leakage current can pass through the base-emitter junction of the output transistor T2, thus maintaining this transistor in an off condition independent of temperature.

As the capacitor 26 discharges through the resistor 42, the voltage of the capacitor approaches that set at the junction 18*a*. When the voltage of the capacitor 26 becomes less positive than at the junction 18*a*, conduction in the base-emitter junction of the driving transistor T1 can again take place, thus beginning the cycle of circuit operation over again.

When the capacitor 26 is charged, positive pulses that are applied from the pulse source 10 through the capacitor 16 to the base electrode of the driving transistor T1 have no effect; but the pulse that approaches most closely the free running turn on time of the circuit will add the necessary potential to cause current to flow in the driving transistor T1, and thus, the circuit can be synchronized with an external pulse, either to multiply or to divide the incoming frequency.

In a particular embodiment of the invention, that was employed for dividing an input frequency of 500 kc. into 100 kc., the following circuit constants were employed, and are specified herein by way of example only:

| Component: | Value |
|---|---|
| Capacitor **16** | 600 μμf. |
| Resistor **20** | 3.3 K. |
| Capacitor **26** | 2700 μμf. |
| Resistor **32** | 1.8 K. |
| Resistor **36** | 18 K. |
| Capacitor **40** | 75 μμf. |
| Resistor **42** | 12000 ohms. |
| Resistor **46** | 470 ohms. |
| Diodes D1 and D2 | SG 22 Transitron silicon diodes. |
| The driving transistor T1 | Junction type Fairchild 2N706 NPN transistor. |
| The output transistor T2 | Junction type 2N695 Motorola PNP transistor. |

Rise time of the output pulse is on the order of 12 millimicroseconds, or 24 megacycles voltage. This invention provides the first circuit that is operable at these frequencies using only R and C type time constants. The circuit is operable over the temperature range −40° C. to +75° C. with any transistors, of the same type. The transistors have no effect on time, but merely turn on and off.

By suitable modification of the circuit component values, extremely accurate frequency division can be obtained with substantially any desired degree of division. For example, an input pulse having a frequency of 500 kc. can be divided down to 1 kc.

To alter the circuit to divide the input frequency down to 1 kc., it is necessary merely to change the values of the timing capacitor and resistor, that is, the capacitor 26 and the resistor 42. Adjustment of the value of the resistor 20 provides a vernier adjustment for the frequency of the two timing components, the capacitor 26 and the resistor 42.

The value of the input capacitor 16 is selected after consideration of the wave form of the input pulse from the pulse source, and depends on the height and rise time of the pulse.

The silicon diodes employed in the specific, preferred circuit described above have the characteristic that they must be subjected to a voltage in the forward direction of 0.70 volt before they will conduct. The diode D1, that is in series with the timing capacitor 26, provides a leakage path so that the timing constants of the circuit are substantially independent of temperature leakage in the driving transistor T1. All of the leakage current for the output transistor T2 goes through the resistor 32 that is connected with the base electrode of that transistor, and the voltage across the diode D2 never builds up to 0.70 volt; accordingly, the emitter of the output transistor T2 is essentially an open circuit and there is no transistor action until the applied voltage is sufficient to cause the diode D2 to conduct.

The load resistor 46, across which the circuit output is taken, is ordinarily kept as low as possible in value so that it will not influence the timing. In the preferred circuit described above, if the resistor 46 were removed entirely and if the junction 44 were connected directly to ground, however, the effect on timing would only be about 5% in value.

The circuit arrangement, in which the capacitor is connected to ground, and in which the diodes D1, D2, are disposed in the emitter electrode circuits of the two transistors, respectively, permits the circuit to start at low temperature and to operate at elevated temperatures without additional bias voltage.

While the invention has been described in connection with a specific embodiment thereof, it will be understood that it is capable of further modifications, and this application is intended to cover any variations, uses, or adaptations of the invention following, in general, the principles of the invention and including such departures from the present disclosure as come within known or customary practice in the art to which the invention pertains and as may be applied to the essential features hereinbefore set forth, and as fall within the scope of the invention or the limits of the appended claims.

I claim:

1. A circuit comprising a source that is adapted to provide direct current potential, first and second electronic valves connected separately across said source, means including a capacitor connected in series with said first valve for applying a biasing voltage of sawtooth waveform to said first electronic valve for turning said first valve on and off, means connecting said first valve to said second valve for turning said second valve on and off, means for superimposing on said biasing voltage a pulsating input voltage to trigger said circuit, and means for taking a pulsed output from said second valve at a frequency other than the frequency of said input voltage.

2. A circuit comprising a source that is adapted to provide direct current potential, first and second transistors each having base, emitter, and collector electrode respecfully, said transistors being connected separately across said source, each transistor being connected across said source through two of its said electrodes, means including a capacitor connected in series with said first transistor for applying a biasing voltage of sawtooth waveform to said first transistor for turning said transistor on and off, means connecting said first transistor to said second transistor for turning said second transistor on and off, means connecting said second transistor to said first transistor for regeneratively accelerating the on and off action of said first transistor, means for superimposing on said biasing voltage a pulsating input voltage to trigger said circuit, and means for taking a pulsed output from said second transistor at a frequency other than the frequency of said input voltage.

3. A circuit comprising a source that is adapted to provide direct current potential, first and second transistors each having base, emitter and collector electrodes, each said transistor being connected across said source through its collector and emitter electrodes, means including a storage capacitor connected in series with the emitter-collector circuit of said first transistor, means for applying a variable condenser-controlled biasing voltage to the base electrode for turning said first transistor on and off, means connecting said first transistor to said second transistor for turning said second transistor on and off, means connecting said second transistor to said first transistor for regeneratively accelerating the on and off action of said first transistor, means for superimposing on said biasing voltage a pulsating input voltage to trigger said circuit, and means for taking a pulsed output from said second transistor at a frequency other than the frequency of said input voltage.

4. A circuit comprising a source that is adapted to provide direct current potential, first and second transistors each having base, emitter and collector electrodes, each said transistor being connected across said source through its collector and emitter electrodes, means including a capacitor and a diode connected in series with each other and in series in the circuit of the emitter electrode of said first transistor, for applying a biasing voltage across the base electrode and the emitter electrode of said first transistor for turning said first transistor on and off, means connecting said first transistor to said second transistor for turning said second transistor on and off, means for superimposing on said biasing voltage a pulsating input voltage to trigger said circuit, and means for taking a pulsed output from said second transistor at a frequency other than the frequency of said input voltage.

5. A circuit comprising a source that is adapted to provide direct current potential, first and second transistors each having base, emitter and collector electrodes, each said transistor being connected across said source through its collector and emitter electrodes, means including a capacitor connected in series in the circuit of said collector and emitter electrodes of said first transistor, and means including voltage dividing means interposed between the output electrode of said second transistor and one terminal of said source of potential, said two means being arranged for applying a biasing voltage across the base electrode and the other electrode of said first transistor in the circuit of which said capacitor is connected, for turning said first transistor on and off, means connecting said first transistor to said second transistor for turning said second transistor on and off, means for superimposing on said biasing voltage a pulsating input voltage to trigger said circuit, and means for taking a pulsed output from said second transistor at a frequency other than the frequency of said input voltage.

6. A circuit comprising a source that is adapted to provide direct current potential, first and second transistors each having base, emitter and collector electrodes, each said transistor being connected across said source through its collector and emitter electrodes, means including a capacitor connected in series with said collector and emitter electrodes of said first transistor, means including resistance means connected between said capacitor and the electrode of said first transistor in the circuit of which said capacitor is connected and an electrode of said second transistor, voltage dividing means interposed between said last-mentioned electrode of said second transistor and one terminal of said source of potential, all of said means being arranged for applying a biasing voltage across the base electrode of said first transistor and the electrode in the circuit of which said capacitor is connected, for turning said first transistor on and off, means connecting said first transistor to said second transistor for turning said second transistor on and off, means for superimposing on said biasing voltage a pulsating input voltage to trigger said circuit, and means for taking a pulsed output from the output electrode of said second transistor at a frequency other than the frequency of said input voltage.

7. A circuit comprising a source that is adapted to provide direct current potential, first and second transistors each having base, emitter and collector electrodes, said transistors being connected separately across said source, each transistor being connected across said source through two of its said electrodes, one electrode of said second transistor serving as an output electrode for said circuit, means including a capacitor connected in series with one electrode of said first transistor between said one electrode and one terminal of said source of potential and resistance means connected between said capacitor and said one electrode of said first transistor and the output electrode of said second transistor, for applying a biasing voltage to said first transistor for turning said transistor on and off, means connecting said first transistor to said second transistor for turning said second transistor on and off, means for superimposing on said biasing voltage a pulsating input voltage to trigger said circuit, and means for taking a pulsed output from the output electrode circuit of said second transistor at a frequency other than the frequency of said input voltage.

8. The circuit of claim 7 including resistance means interposed between one electrode of said first transistor to which said biasing voltage is applied, and the other terminal of said source of direct current potential, to adjust the biasing voltage.

9. The circuit of claim 7 including a diode interposed between said capacitor and the electrode of the first transistor in the circuit of which said capacitor is connected.

10. The circuit of claim 9 including a diode that is operatively disposed in the emitter electrode circuit of said second transistor.

11. A circuit comprising a source that is adapted to provide direct current potential, a first transistor of the NPN type, a second transistor of the PNP type, each of said transistors having base, emitter and collector electrodes, said transistors being connected separately across said source, each transistor being connected across said source through two of its said electrodes, means including capacitance means connected in series with said emitter and collector electrodes of said first transistor and one terminal of said source of potential and resistance means connected between said last-mentioned electrode of said first transistor and the base electrode thereof for applying a biasing potential to said first transistor for turning said first transistor on and off, means connecting said first transistor to said second transistor for turning said second transistor on and off, means for superimposing on said biasing voltage a pulsating input voltage to trigger said circuit, and means for taking a pulsed output from the circuit of one electrode of said second transistor at a frequency other than the frequency of said input voltage.

12. A circuit comprising a source that is adapted to provide direct current potential, a first transistor of the NPN type, a second transistor of the PNP type, each said transistor having base, emitter and collector electrodes, each said transistor being connected across said source separately from the other through its respective collector and emitter electrodes, means including capacitance means connected in series with the emitter-collector circuit of said first transistor and voltage dividing means interposed between one terminal of said source of potential and one terminal of said second transistor which serves as the output electrode for said circuit, for applying a biasing voltage to said first transistor to turn said first transistor on and off, means connecting said first transistor to said second transistor for turning said second transistor on and off, means for superimposing on said biasing voltage a pulsating input voltage to trigger said circuit, and means for taking a pulsed output from said output electrode of said second transistor at a frequency other than the frequency of said input voltage.

References Cited in the file of this patent

UNITED STATES PATENTS

| | | |
|---|---|---|
| 2,482,561 | Shenk | Sept. 20, 1949 |
| 2,627,576 | Howarth | Feb. 3, 1953 |
| 2,831,113 | Weller | Apr. 15, 1958 |